United States Patent
Ye

(10) Patent No.: US 12,243,905 B2
(45) Date of Patent: Mar. 4, 2025

(54) METHOD OF FORMING METAL GRID, BACKSIDE-ILLUMINATED IMAGE SENSOR AND METHOD OF FORMING THE SAME

(71) Applicant: WUHAN XINXIN SEMICONDUCTOR MANUFACTURING CO., LTD., Hubei (CN)

(72) Inventor: Guoliang Ye, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 557 days.

(21) Appl. No.: 17/566,386

(22) Filed: Dec. 30, 2021

(65) Prior Publication Data
US 2023/0040031 A1    Feb. 9, 2023

(30) Foreign Application Priority Data
Aug. 6, 2021   (CN) .......................... 202110902521.6

(51) Int. Cl.
H01L 27/146    (2006.01)

(52) U.S. Cl.
CPC .. *H01L 27/14685* (2013.01); *H01L 27/14623* (2013.01); *H01L 27/14636* (2013.01); *H01L 27/1469* (2013.01); *H01L 27/14634* (2013.01)

(58) Field of Classification Search
CPC ......... H01L 27/14685; H01L 27/14623; H01L 27/14627; H01L 27/1464; H01L 27/14636; H01L 27/1469
See application file for complete search history.

(56) References Cited

U.S. PATENT DOCUMENTS

| | | | |
|---|---|---|---|
| 8,435,824 B2 * | 5/2013 | Tsai | H01L 24/05 257/460 |
| 8,796,805 B2 * | 8/2014 | Ting | H01L 27/1464 438/57 |
| 10,847,564 B1 * | 11/2020 | Su | H01L 27/14687 |

(Continued)

FOREIGN PATENT DOCUMENTS

| | | |
|---|---|---|
| CN | 103187256 A | 7/2013 |
| CN | 103681704 A | 3/2014 |

(Continued)

*Primary Examiner* — Phat X Cao
(74) *Attorney, Agent, or Firm* — MUNCY, GEISSLER, OLDS & LOWE, P.C.

(57) ABSTRACT

The present invention provides a method of forming a metal grid, a backside illuminated (BSI) image sensor, and a method of forming the BSI image sensor. In the methods, an etch stop layer and a metal material layer are successively deposited in geometric conformity over a substrate already formed therein with a recess and a conductive pillar, followed by the formation of a bonding pad on the metal material layer in the recess. After that, a dielectric cap layer is deposited and etched together with the metal material layer and the etch stop layer to form the metal grid. According to the present invention, the deposited metal material layer has reduced surface roughness, which results in improved thickness uniformity of the resulting metal grid. The metal grid is overall easier to form, resulting in savings in cost and increased performance of the device being fabricated.

14 Claims, 4 Drawing Sheets

(56) References Cited

U.S. PATENT DOCUMENTS

| | | |
|---|---|---|
| 11,728,364 B2 * | 8/2023 | Lin .................. H01L 27/14621 257/432 |
| 2016/0300871 A1 | 10/2016 | Borthakur et al. |
| 2018/0019280 A1 | 1/2018 | Lee et al. |
| 2019/0067345 A1 | 2/2019 | Qi et al. |
| 2020/0411585 A1 | 12/2020 | Huang et al. |
| 2021/0050460 A1 | 2/2021 | Lin et al. |

FOREIGN PATENT DOCUMENTS

| | | |
|---|---|---|
| CN | 106298829 A | 1/2017 |
| CN | 107221541 A | 9/2017 |
| CN | 110783358 A | 2/2020 |
| CN | 111029349 A | 4/2020 |
| CN | 111029353 A | 4/2020 |
| CN | 111146217 A | 5/2020 |
| CN | 112397535 A | 2/2021 |
| CN | 112397541 A | 2/2021 |
| KR | 101448369 B1 | 10/2014 |
| KR | 20180007493 A | 1/2018 |
| KR | 20200040617 A | 4/2020 |
| KR | 20200051867 A | 5/2020 |
| WO | WO-2012/008120 A1 | 1/2012 |
| WO | WO-2013/086813 A1 | 6/2013 |

* cited by examiner

METHOD OF FORMING METAL GRID, BACKSIDE-ILLUMINATED IMAGE SENSOR AND METHOD OF FORMING THE SAME

CROSS-REFERENCE TO RELATED APPLICATION

This application claims the priority of Chinese patent application number 202110902521.6, filed on Aug. 6, 2021, the entire contents of which are incorporated herein by reference.

TECHNICAL FIELD

The present invention relates to the technical field of fabrication of image sensors and, more specifically, to a method of forming a metal grid, a backside illuminated (BSI) image sensor and a method of forming the BSI image sensor.

BACKGROUND

Used to enable the capture of an image by converting optical signals thereof into electrical signals, image sensors are considered as a key component of imaging devices. CMOS image sensors (CIS) have been widely used in various applications thanks to their advantages of low power consumption and a high signal-to-noise ratio.

Image sensors are either backside illuminated (BSI) or front-side illuminated (FSI) depending on how they receive radiation. In a BSI image sensor, light is incident on a backside of its substrate and travels to photodiodes in the substrate while wires or other components that may affect the reception of radiation are basically arranged on a front side of the substrate. This allows an increased amount of incidence and hence significantly improved imaging quality under a given light condition.

However, existing BSI image sensors and their manufacturing processes cannot meet the requirement of products with higher performance.

SUMMARY OF THE DISCLOSURE

It is an object of the present invention to provide a method of forming a metal grid, a BSI image sensor and a method of making the BSI image sensor, which can provide improved product performance.

This object is attained by a method of forming a metal grid, which comprises:

providing a substrate containing a conductive component and a conductive pillar, the substrate having a surface in which a recess is formed, the conductive pillar received in a through-hole extending from a bottom surface of the recess to a top surface of the conductive component so as to come into electrical connection with the conductive component;

successively depositing an etch stop layer and a metal material layer in geometric conformity over surfaces of the substrate, the conductive pillar and the recess;

forming a bonding pad on the metal material layer in the recess and depositing a dielectric cap layer over the bonding pad and the metal material layer; and etching the dielectric cap layer, the metal material layer and the etch stop layer that are peripheral to the recess, resulting in the formation of the metal grid.

Optionally, the conductive component may comprise a metal interconnect, and/or wherein the etch stop layer may be made of a material that is neither silicon oxide nor silicon nitride and is able to prevent a metal from diffusing into the substrate from the metal material layer.

Optionally, the step of forming the recess and the conductive pillar in the substrate may comprise:

forming the recess by etching through a partial thickness of the substrate above the conductive component;

depositing a buffer dielectric layer in geometric conformity over the surfaces of the substrate and the recess so that the buffer dielectric layer does not fill up the recess;

forming the through-hole by etching the buffer dielectric layer and the substrate that are in positional correspondence with the recess until the top surface of the conductive component is exposed; and forming the conductive pillar by filling the through-hole with a conductive material.

Optionally, the buffer dielectric layer may comprise, sequentially stacked together, a first oxide layer, a nitride layer and a second oxide layer, wherein the step of forming the conductive pillar by filling the through-hole with the conductive material comprises: depositing a conductive material over the second oxide layer and in the through-hole so that it at least fills up the through-hole; and performing an etch-back process and/or a chemical mechanical planarization to remove the second oxide layer, the nitride layer and the conductive material above top edges of the through-hole, resulting in the formation of the conductive pillar.

Optionally, the step of providing the substrate containing the conductive component may comprise:

providing a device substrate having a front side and a backside and forming a logic device and a photodiode on the front side of the device substrate;

performing a metal interconnect process to form an interlayer dielectric layer covering the logic device and the photodiode on the front side of the device substrate and forming the metal interconnect in electrical connection with the logic device as the conductive component in the interlayer dielectric layer;

providing a carrier substrate and forming a bonding dielectric layer on the carrier substrate; and bonding the interlayer dielectric layer to the bonding dielectric layer, thus resulting in the formation of the substrate containing the conductive component.

Optionally, after the interlayer dielectric layer is bonded to the bonding dielectric layer, the device substrate may be thinned from the backside thereof, and the recess may be formed in the backside of the device substrate through etching a partial thickness thereof.

Optionally, when the dielectric cap layer, the metal material layer and the etch stop layer that are peripheral to the recess are etched to form the metal grid, the etch stop layer and a partial thickness of the layer under the etch stop layer are also etched through; and/or before or after the metal grid is formed, the dielectric cap layer on the top surface of the bonding pad is etched through so that the top surface of the bonding pad is partially exposed.

Based on the same inventive concept, the present invention also provides a method of making a BSI image sensor, which comprises: providing a substrate defining a pixel region and a logic region; and forming a recess accommodating a bonding pad in a backside of the substrate in the logic region and a metal grid on the backside of the substrate in the pixel region, using the above method.

Based on the same inventive concept, the present invention also provides a BSI image sensor comprising:

a substrate defining a pixel region and a logic region peripheral to the pixel region, wherein a recess is formed in a surface of the substrate in the logic region;

a conductive component buried in the substrate in the logic region;

a conductive pillar received in a through-hole extending from a bottom surface of the recess to a top surface of the conductive component so as to come into electrical connection with the conductive component; and an etch stop layer, a metal material layer and a dielectric cap layer, which are sequentially deposited in geometric conformity over the substrate, wherein a metal grid is formed in the pixel region by etching through the etch stop layer, the metal material layer and the dielectric cap layer, and the dielectric cap layer on a top surface of the bonding pad in the logic region is etched through so that the top surface of the bonding pad is partially exposed.

Optionally, the substrate may comprise:

a device substrate having a front side and a backside, wherein a logic device is formed on the front side of the device substrate in the logic region, wherein the recess is formed in the backside of the device substrate in the logic region, and wherein a photodiode is formed in the front side of the device substrate in the pixel region; and an interlayer dielectric layer formed on the front side of the device substrate so as to cover the logic device and the photodiode, wherein a metal interconnect in electrical connection with the conductive pillar and the logic device is formed in the interlayer dielectric layer as the conductive component.

Optionally, the substrate further comprises:

a carrier substrate, formed on a side of the interlayer dielectric layer that faces away from the device substrate.

Optionally, the interlayer dielectric layer includes at least one of a low-k dielectric, a high-k dielectric, silicon oxide, silicon nitride, an organic material (e.g., polyimide), a TEOS oxide, phosphosilicate glass (PSG), borophosphosilicate glass (BPSG), fluorinated silicate glass (FSG), a carbon-doped silicon oxide;

wherein, the low-k dielectric has a k value less than 3.0, and the high-k dielectric has a k value greater than 7.0.

Optionally, the device substrate is made of at least one of Si, SiGe, SiGeC, SiC, GaAs, InAs, and InP.

Compared to the prior art, the present invention has at least one of the following advantages:

1. Successively depositing the etch stop layer and the metal material layer in geometric conformity over the substrate formed therein with the recess and the conductive pillar enables the etch stop layer to impart reduced surface roughness to the deposited metal material layer, which results in improved thickness uniformity of the metal grid and thus enhanced performance of the image sensor being fabricated.

2. The etch stop layer is formed of a material, which is neither silicon oxide nor silicon nitride and able to block metal diffusion from the metal material layer into the substrate and includes, for example, at least one of Ti, Ta, Cr, TiW, TiN and TaN. Moreover, this material allows for the use of an etchant having a high etch selectivity ratio of the metal material layer to the etch stop layer in the etching process for forming the metal grid, avoiding the problems with the prior art arising from the necessary additional etching of the silicon oxide layer and the silicon nitride layer under the metal material layer, including pinholes in the surface of the dielectric cap layer residing on the top surface of the metal grid and residuals of the silicon nitride layer under the metal grid. As a result, an additional improvement in the performance of the image sensor is achieved.

3. During the formation of the metal grid by etching the dielectric cap layer, the metal material layer and the etch stop layer that are peripheral to the recess, the etch stop layer may be over-etched so that a partial thickness of the layer underlying the etch stop layer is also removed. This dispenses with the need in the prior art for an additional process for etching the silicon oxide layer and silicon nitride layer under the metal material layer, resulting in cost savings.

4. Before the metal grid is formed by etching the metal material layer, the bonding pad is formed on the metal material layer in the recess, and the dielectric cap layer is deposited over the bonding pad and the metal material layer. Additionally, the metal grid is formed by etching the dielectric cap layer, the metal material layer and the etch stop layer that are peripheral to the recess under the protection of the dielectric cap layer. This dispenses with the need in the prior art for separately forming a hard mask layer on the top surface of the dielectric cap layer, resulting in additional cost savings.

5. The metal grid is overall easier to form, satisfying the demand for an image sensor with higher performance.

DETAILED DESCRIPTION

Figure 1:
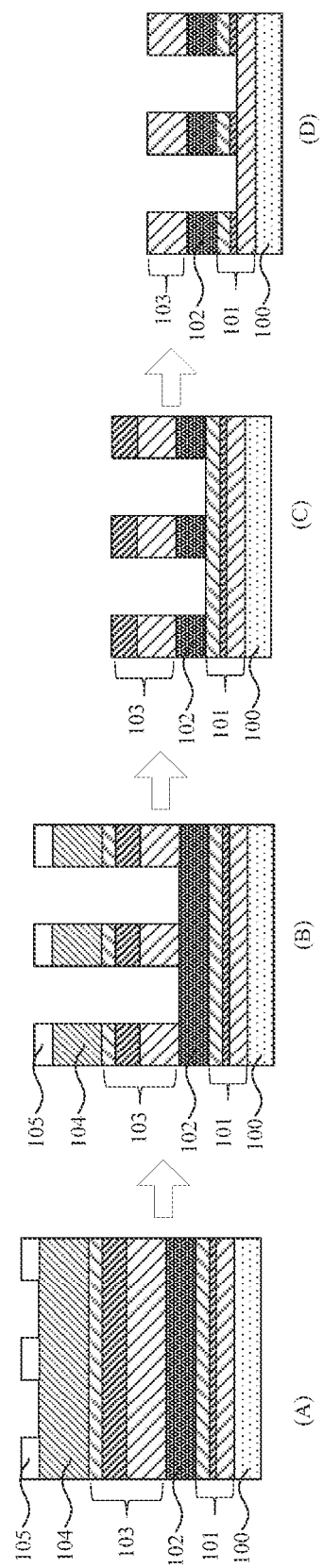
FIG. 1 depicts schematic cross-sectional views of intermediate structures in a conventional method of forming a metal grid.

In the following detailed description, numerous specific details are set forth in order to provide a more thorough understanding of the present invention. However, it will be apparent to one skilled in the art that the present invention may be practiced even without one or more of these specific details. In other instances, the description of some technical features well-known in the art is omitted in order to avoid obscuring the present invention. It will be understood that the present invention can be carried out in various forms and should not be construed as being limited to the embodiments disclosed herein. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. It will be understood that when an element or a layer is referred to as being "on" or "connected to" another element or layer, it can be directly on or directly connected to the other element or layer, or intervening elements or layers may also be present. In contrast, when an element is referred to as being "directly on" or "directly connected to" another element, there are no intervening elements or layers present. Although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Spatially relative terms, such as "under," "below," "lower," "over," "upper" and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may otherwise be oriented (rotated 90 degrees or at other orientations) and the spatially relative descriptors used herein interpreted accordingly. The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items.

The prior art and the present invention will be described in greater detail below by way of specific embodiments with reference to the accompanying drawings. Advantages and features of the present invention will become more apparent from the following description. Note that the figures are provided in a very simplified form not necessarily drawn to exact scale for the only purpose of helping to explain the embodiments disclosed herein in a more convenient and clearer way.

In a backside illuminated (BSI) image sensor, a metal grid may be formed to mitigate optical crosstalk between different light reception elements. Conventionally, the formation of such a metal grid usually includes the step as detailed below.

At first, referring to FIG. 1A, a substrate 100 defining a pixel region (not shown) and a logic region (not shown) is provided. In the logic region, logic devices (not shown) and metal interconnects (not shown) are formed on a front side of the substrate, while recesses (not shown) are formed in a backside of the substrate. Conductive pillars (e.g., Through Silicon Vias (TSV), not shown) are so formed in the substrate as to interfaces with bottoms of the recesses, and bonding pads (not shown) are formed on the bottoms of the recesses. Bottoms of the bonding pads are in electrical contact with tops of the conductive pillars, and bottoms of the conductive pillars are in electrical contact with tops of the metal interconnects.

Subsequently, with continued reference to FIG. 1A, over the backside of the substrate 100 are successively deposited an ONO buffer dielectric layer 101 (which is a stack of a silicon oxide layer, a silicon nitride layer and another silicon oxide layer, successively deposited over the backside of the substrate 100), a tungsten (W) layer 102 (usually deposited by CVD), a dielectric cap layer 103 (which is a stack of a silicon oxide layer, a silicon nitride layer and another silicon oxide layer, successively deposited over a surface of the W layer 102) and a hard mask layer 104. A patterned photoresist layer 105 is then formed on the hard mask layer 104 using a photolithography process including photoresist coating, development and other steps. The hard mask layer 104 often includes at least one of an advanced patterning film (APF, amorphous carbon) a spin-on carbon (SOC) layer and an organic dielectric layer (ODL).

After that, referring to FIG. 1(B), with the patterned photoresist layer 105 as a mask, the hard mask layer 104 and the dielectric cap layer 103 are etched until the surface of the W layer 102 is exposed.

Afterward, referring to FIG. 1(C), the patterned photoresist layer 105, the hard mask layer 104 and the upper silicon oxide layer in the dielectric cap layer 103 are removed, and the W layer 102 is etched with the remainder of the dielectric cap layer 103 as a mask, resulting in the formation of a metal grid defining a lattice of cells.

Thereafter, referring to FIG. 1(D), with the remainder of the dielectric cap layer 103 and the metal grid as a mask, portions of the upper silicon oxide layer and the silicon nitride layer in the buffer dielectric layer 101 exposed in the grid cells (i.e., portions thereof enclosed by bottom edges of the remaining W layer 102) are etched away.

A matrix of color filters is then formed in the respective grid cells.

However, despite the current trend of BSI image sensors toward a greater number of smaller pixels and a thicker backside metal grid, the existing metal grid formation techniques suffer from the following drawbacks.

1. The W layer 102 directly deposited on silicon ox by CVD has a very rough surface, leading to an uneven thickness of the metal grid, which is detrimental to the subsequent formation of the color filter matrix and thus to the performance of the final image sensor.

2. After the metal grid is formed by etching the W layer 102, it is necessary to additionally etch away the silicon oxide and silicon nitride portions exposed in the grid cells. This may cause damage to the silicon oxide layer on top of the metal grid and create pinholes in the surface of the silicon oxide layer on top of the W layer 102 peripheral to the metal grid (spanning over the logic region and part of the pixel region). Further, other defects may occur, such as silicon nitride residuals on bottoms of the resulting grid cells.

All these drawbacks limit the performance improvement of BSI image sensors.

In view of this, the present invention provides a method of forming a metal grid, a BSI image sensor and a method of forming the BSI image sensor. As the formed metal grid has a uniform thickness along with fewer defects, the BSI image sensor exhibits improved performance.

Figure 2:
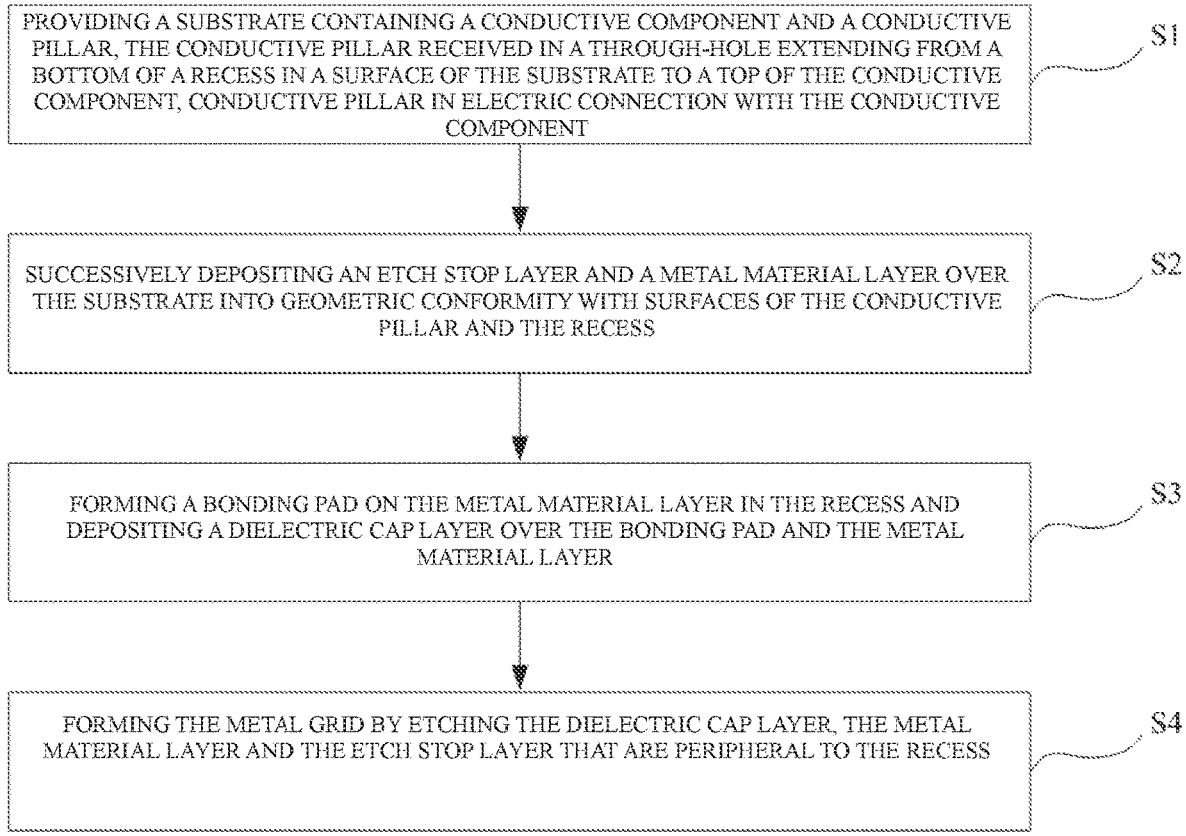
FIG. 2 is a flowchart of a method of forming a metal grid according to an embodiment of the present invention.

Referring to FIG. 2, in an embodiment of the present invention, the method of forming the metal grid comprises the steps of:

(S1) providing a substrate containing a conductive component and a conductive pillar, the conductive pillar received in a through-hole extending from a bottom of a recess in a surface of the substrate to a top of the conductive component, conductive pillar in electric connection with the conductive component;

(S2) successively depositing an etch stop layer and a metal material layer over the substrate into geometric conformity with surfaces of the conductive pillar and the recess;

(S3) forming a bonding pad on the metal material layer in the recess and depositing a dielectric cap layer over the bonding pad and the metal material layer;

(S4) forming the metal grid by etching the dielectric cap layer, the metal material layer and the etch stop layer that are peripheral to the recess.

Referring to FIGS. 3(A) to 3(C) and 4, the provision of the substrate 200 having the conductive component 200a, the recess 204a, the through-hole 204c and the conductive pillar 204 may include the steps as follows:

Step S1.1: Provide a device substrate 200b having a front side (the side of 200b facing downward, as viewed in the orientation of FIG. 4) and a backside (the side of 200b facing upward, as viewed in the orientation of FIG. 4), as shown in FIGS. 3(A) and 4. The device substrate 200b may be any substrate material suitable for the fabrication of image sensors known to those skilled in the art, such as Si, SiGe, SiGeC, SiC, GaAs, InAs, InP or any other suitable semiconductor material. Logic devices and photodiodes may be formed on the front side of the device substrate 200b in the front-end-of-line (FEOL) phase of an integrated circuit fabrication process through, among others, ion implantation and formation of device isolation structures (e.g., shallow trench isolation (STI), deep trench isolation (DTI), local oxidation isolation, etc.). The photodiodes may be formed in a pixel region I optionally into an array consisting of rows and columns, while the logic devices may be formed in a logic region II peripheral to the pixel region I. The logic devices may include various passive and active micro-electronic elements such as at least one of resistors, capacitors, inductors, diodes, metal-oxide-semiconductor field effect transistors (MOSFETs), complementary MOS (CMOS) transistors, bipolar junction transistors (BJTs), lateral diffusion MOS (LDMOS) transistors, high power MOS transistors and fin field effect transistors (FinFEFs).

Step S1.2: Form an interlayer dielectric layer 200c on the front side of the device substrate 200b and a metal interconnect in electrical connection with each of the logic devices in the interlayer dielectric layer 200c as the conductive component 200a in a back-end-of-line (BEOL) phase of the integrated circuit fabrication process using metal interconnect processes (e.g., including least one of a contact hole process, a damascene process and a bonding pad process), as also shown in FIGS. 3(A) and 4. The interlayer dielectric layer 200c may be either a single layer or a stack of multiple layers and may be deposited during the formation of corresponding metal layers in the metal interconnect. The metal interconnect may include multiple metal wires in different layers and one or more vias connecting each adjacent pair of the metal wires. In some exemplary embodiments, the interlayer dielectric layer 200c may include at least one of a low-k dielectric, a high-k dielectric, silicon oxide, silicon nitride, an organic material (e.g., polyimide), a TEOS oxide, phosphosilicate glass (PSG), borophosphosilicate glass (BPSG), fluorinated silicate glass (FSG), a carbon-doped silicon oxide, etc. The low-k dielectric may have a k value less than 3.0, and the high-k dielectric may have a k value greater than 7.0. In this embodiment, surfaces of the metal interconnect and the interlayer dielectric layer 200c may be flush with each other in order to provide a bonding surface.

Step S1.3: provide a carrier substrate 200d and form thereon a bonding dielectric layer, as also shown in FIGS. 3(A) and 4. The bonding dielectric layer may include, among others, silicon oxide and/or silicon nitride. The carrier substrate 200d may have experienced rewiring or other processing, or may be a bare silicon substrate or glass. It may provide mechanical strength and support as required by the backside processing of the device substrate 200b.

Step S1.4: Bond the interlayer dielectric layer 200c to the bonding dielectric layer of the carrier substrate 200d and grind and thin the device substrate 200b from the backside thereof (i.e., the surface facing away from the device substrate 200b) so as to allow light to reach the photodiodes in the pixel region I from the backside of the device substrate 200b, as also shown in FIGS. 3(A) and 4.

Step S1.5: Form the recess 204a having a required depth by an etching process in the backside of the device substrate 200b, as also shown in FIGS. 3(A) and 4.

Optionally, concurrently with the formation of the recess 204a. in the backside of the device substrate 200b, a number of trenches 204b narrower than the recess 204a may be also formed in the pixel region I of the device substrate 200b. Alternatively, after the recess 204a is formed in the backside of the device substrate 200b, and before the buffer dielectric layer 203 detailed below is formed, a pad oxide layer (not shown) may be formed on the backside of the device substrate 200b, and a number of trenches 204b narrower than the recess 204a may be formed by etching the pad oxide layer and the device substrate 200b in the region peripheral to the recess 204a (i.e., the pixel region I) from the backside of the device substrate 200b. Alternatively, before the recess 204a is formed by etching the device substrate 200b from the backside thereof, a number of trenches 204b narrower than the recess 204a may be formed in the pixel region I of the device substrate 200b.

The trenches 204b may have a depth that is less than, or equal to, or greater than the depth of the recess 204a. A dielectric material may be filled in the trenches 204b, resulting in the formation of deep trench isolation structures capable of physically and electrically isolating the photodiodes and other components that have been formed in the device substrate 200b. Therefore, the number of the trenches 204b may be matched with the number of the photodiodes that have been formed in the pixel region I of the device substrate 200b or the number of the metal grid cells that will be subsequently formed in the pixel region I of the device substrate 200b.

In other embodiments of the present invention, the formation of the trenches 204b may be omitted.

Step S1.6: Deposit the buffer dielectric layer 203 over the backside of the device substrate 200b as well as inner surfaces of the recess 204a by a suitable process such as deposition or coating, as also shown in FIGS. 3(A) and 4. The buffer dielectric layer 203 may be a stack of multiple layers. As an example, the buffer dielectric layer 203 may consist of a first oxide layer 203a, a nitride layer 203b and a second oxide (or oxynitride) layer 203c, and the first oxide layer 203a may be thick enough to fill up the trenches 204b in the pixel region. Following the deposition of the first oxide layer 203a, a top surface thereof may be planarized to ensure good thickness uniformity of the subsequently deposited layers and to prevent an uneven thickness of the subsequently formed metal grid. The buffer dielectric layer 203 may be capable of: (1) serving as an etch stop layer and a protective layer for the device substrate 200b during the subsequent process to etch the device substrate 200b to form therein the through-hole 204c; (2) providing paths for the propagation of light incident on the backside of the device substrate 200b; and (3) separating the metal material layer to be processed to form the metal grid from the device substrate 200b.

Optionally, prior to the deposition of the buffer dielectric layer 203, one or more thin bottom anti-reflective coating layers 202 including at least one of silicon nitride, silicon oxynitride, a high-k dielectric, a metal nitride (e.g., titanium nitride, tantalum nitride), a metal oxide, etc. may be formed over the backside of the device substrate 200b as well as inner surfaces of the recess 204a by a suitable process such as deposition or coating. Optionally, the bottom anti-reflective coatings 202 may be negatively charged and repulse electrons produced by the photodiodes in the device substrate 200b from light that travels through the device substrate 200b to the photodiodes from the backside of the device substrate 200b, thus directing the electrons to move away from the bottom anti-reflective coatings 202. This can mitigate the generation of noise and dark currents.

Step S1.7: Etch away part of each of the buffer dielectric layer 203, bottom anti-reflective coatings 202 and the device substrate 200b at bottom of the recess 204a (in alignment with the conductive component 200a) by both photolithography and etching until a top surface of the conductive component 200a (i.e., the surface thereof facing upward toward the recess 204a) is exposed so that through-hole (TSV) 204c is formed, as shown in FIGS. 3(B) and 4.

Step S1.8: Deposit a conductive material that may include at least one of metals (e.g., including at least one of Co, W, Cr, Mo, Ni, Cu, etc.), doped polysilicon, metal silicide, etc. over surfaces of the buffer dielectric layer 203, the recess 204a and the through-hole 204c using a suitable process such as physical vapor deposition (PVD) or chemical vapor deposition (CVD) until the deposited material fills up at least the through-hole 204c, and then remove the second oxide layer 203c, the nitride layer 203b and undesired portion of the conductive material above top edges of the through-hole 204c using an etch-back process and/or a chemical mechanical planarization (CMP) process, thus forming the conductive pillar 204, as shown in FIGS. 3(B) to (C) and 4. At the bottom of the recess 204a, a top surface of the conductive pillar 204 may be substantially flush with a top surface of the first oxide layer 203a.

Referring to FIGS. 3(D) and 4, in step S2, the etch stop layer 205 is deposited on the surfaces of the first oxide layer 203a and the conductive pillar 204 by means of chemical vapor deposition, atomic layer deposition or the like. The metal material layer 206 to be processed to form the metal grid is then deposited on the etch stop layer 205 using a suitable process such as chemical vapor deposition or atomic layer deposition.

Thicknesses of the etch stop layer 205 and the metal material layer 206 in the pixel region I should ensure that a thickness of the metal grid is required by the image sensor. The etch stop layer 205 may be formed of a material that is neither silicon oxide nor silicon nitride and may serve to: (1) provide a flat surface on which the metal material layer 206 is deposited in the pixel region I and thus ensure a uniform thickness of the metal material layer 206 deposited in the pixel region I and hence a uniform thickness of the subsequently formed metal grid, (2) block metal diffusion from the metal material layer 206 into the device substrate 200b, (3) provide an etch stopper for the subsequent process for etching the metal material layer 206 to form the metal grid, as well as a high etching selectivity ratio to the metal material layer 206, which avoids residuals at bottoms of the formed grid cells from the etching process, (4) enable a high etching selectivity ratio of the metal material layer 206 to the dielectric cap layer 208 on the surface thereof in the subsequent process for etching the metal material layer 206 to form the metal grid, which avoids the formation of pinholes at the surface of the dielectric cap layer 208, and (5) bring the formed bonding pad 207 into electrical connection with the conductive pillar 204 via the metal material layer 206 and the etch stop layer 205.

As an example, the etch stop layer 205 may be formed of a material including at least one of titanium nitride (TiN), tantalum nitride (TaN), titanium (Ti), tantalum (Ta), titanium-tungsten (TiW), titanium silicide (TiSi), titanium silicon nitride (TiSiN), tantalum silicon nitride (TaSiN), nickel-vanadium (NiV) and tungsten nitride (WN).

Referring to FIGS. 3(D) to (E) and 4, in step S3, a suitable process such as physical vapor deposition (PVD) or chemical vapor deposition (CVD) may be performed to deposit a bonding pad material layer over the metal material layer 206. Portions of the bonding pad material layer around and within the recess 204a may be then removed by both photolithography and etching, resulting in the formation of the bonding pad 207 aligned with the conductive pillar 204 and brought into electrical connection therewith by the underlying metal material layer 206 and etch stop layer 205. Subsequently, a suitable process such as spin coating or chemical vapor deposition may be carried out to form the dielectric cap layer 208 in geometric conformity with surfaces of the bonding pad 207 and the metal material layer 206 exposed. Optionally, the bonding pad 207 may be formed of a material including at least one of nickel (Ni), aluminum (Al), silver (Ag), gold (Au), tungsten (W), etc. The dielectric cap layer 208 may consist of a single layer or a stack of multiple layers. It can protect the desired metal material layer 206 and bonding pad 207 and serve as a hard mask layer in the process for etching the metal material layer 206 to form the metal grid, dispensing with the need for separately depositing a hard mask layer on a top surface of the dielectric cap layer, as required in the conventional techniques. Optionally, the dielectric cap layer 208 may be formed of a material that may include at least one of silicon oxide, silicon nitride and silicon oxynitride. As an example, the dielectric cap layer 208 may consist of, stacked sequentially over the metal material layer 206, a silicon oxide layer, a silicon nitride layer and a silicon oxynitride layer. Optionally, the dielectric cap layer 208 may be not thick enough to fill up the recess 204a, thus leaving a recessed groove surrounding the bonding pad 207, which can receive a welding flux and prevent it from flowing outside the recess 204a during the subsequent bonding or bumping of the bonding pad.

It is to be noted that the bonding pad 207 may also be formed using a metal lift-off process involving first applying photoresist, forming a window defining the bonding pad 207 in the photoresist by photolithography, depositing a bonding pad material layer, removing the photoresist and undesired portions of the bonding pad material layer so that the remainder of the bonding pad material layer forms the bonding pad 207.

Referring to FIGS. 3(E) to (F) and 4, in step S4, photoresist may be applied in the form of a layer onto the dielectric cap layer 208 and then exposed and developed to form a pattern defining the metal grid in the photoresist layer. Subsequently, with the patterned photoresist layer serving as a mask, an etching process may be performed in the pixel region I (outside the recess 204a), which may proceed through the dielectric cap layer 208 and the metal material layer 206 and stop at a surface of the etch stop layer 205. After that, the photoresist layer may be stripped away, and with the dielectric cap layer 208 serving as a mask, the etch stop layer 205 in the pixel region I may be etched through, exposing the surface of the buffer dielectric layer 203. As a result, the metal grid defining grid cells 209 in which the surface of the buffer dielectric layer 203 is exposed is formed in the pixel region I. Afterward, the dielectric cap layer 208 above the bonding pad 207 may be etched through by means of a series of photolithography and etching processes, resulting in the formation an opening 208a in which a top surface of the bonding pad 207 is partially exposed.

Optionally, the etch stop layer 205 in the pixel region I may be over-etched so that a partial thickness of the buffer dielectric layer 203 (e.g., spanning the second silicon oxide layer 203c or both the second silicon oxide layer 203c and the silicon nitride layer 203b) underlying the etch stop layer 205 may be also etched through.

It is to be noted that the opening 208a which is formed by etching through the dielectric cap layer 208 residing on the top surface of the bonding pad 207 and in which the top surface of the bonding pad 207 is partially exposed is not limited to being formed at the time as described in the above example, and in other embodiments of the present invention, it may be formed either before or after the metal grid is formed by etching the metal material layer 206 in the pixel region I.

Figure 3:
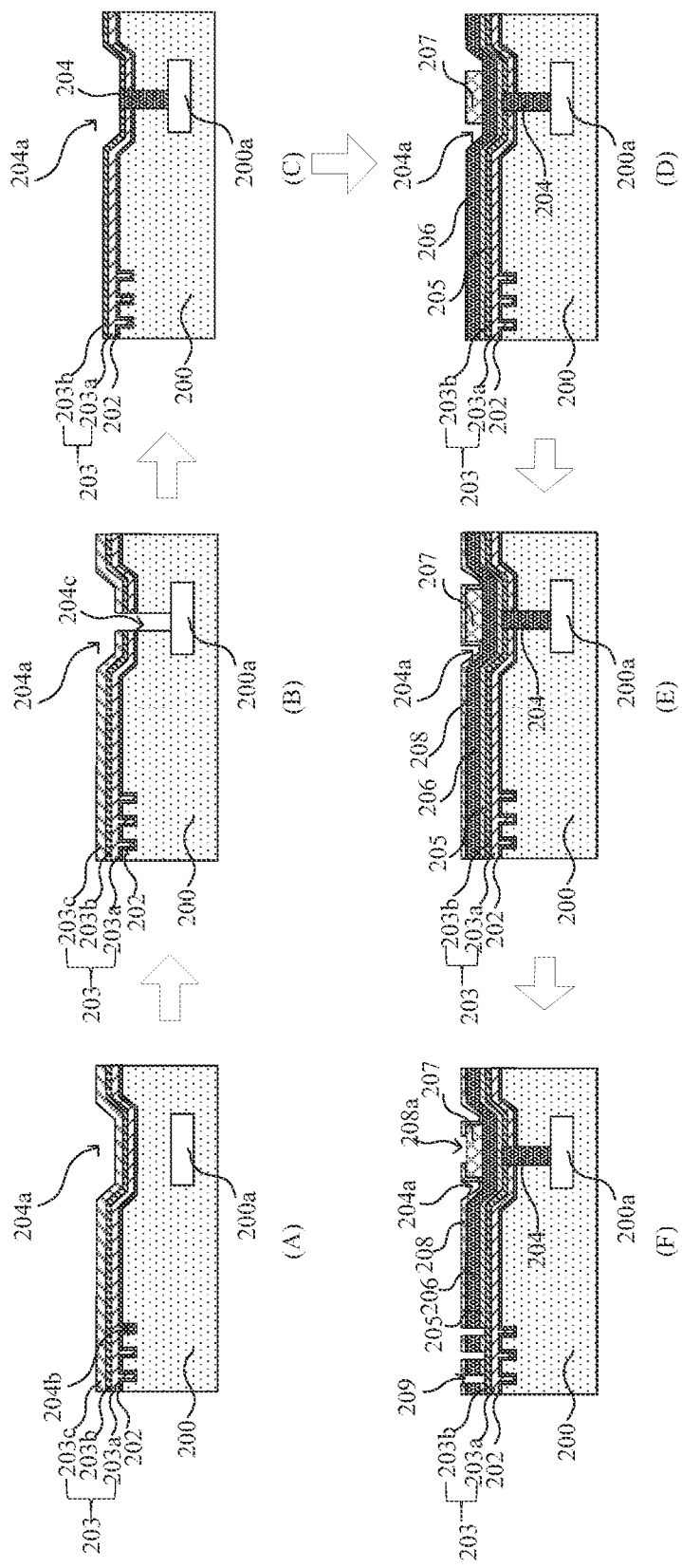
FIG. 3 depicts schematic cross-sectional views of intermediate structures in a method of forming a metal grid according to an embodiment of the present invention.
Figure 4:
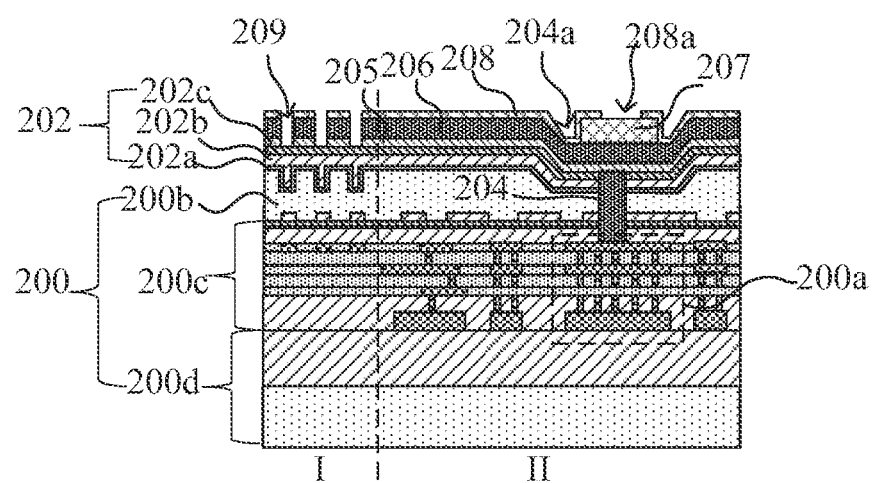
FIG. 4 is a schematic cross-sectional view of a BSI image sensor according to an embodiment of the present invention.

Based on the same inventive concept, referring to FIGS. 2 to 4, in an embodiment of the present invention, there is provided a method of forming a backside illuminated (BSI) image sensor, comprising: providing a substrate 200 defining a pixel region I and a logic region II; and forming a recess 204a accommodating therein a bonding pad 207 on a backside of the substrate 200 in the logic region II and a metal grid on the backside in the pixel region I of the substrate 200, using the method of the present invention as defined above.

In addition, a conductive component 200a is formed on a front side of the substrate 200 in the logic region II, and a conductive pillar 204 is formed in the substrate 200 under the recess 204a. The conductive pillar 204 is received in a through-hole 204c extending from a bottom surface of the recess 204a to a top surface of the conductive component 200a in the logic region II. The substrate 200 having the conductive component 200a, the recess 204a, the through-hole 204c and the conductive pillar 204 may be provided in a similar manner as described above in step S1, and any further description thereof is therefore omitted.

Under the bonding pad 207, there are a metal material layer 206 and an etch stop layer 205, which are deposited in the same process as the metal grid and bring a bottom surface of the bonding pad 207 into electrical connection with a top surface of the conductive pillar 204.

In summary, in the methods of the present invention, an etch stop layer and a metal material layer are successively deposited in geometric conformity over a substrate already formed therein with a recess and a conductive pillar, followed by the formation of a bonding pad on the metal material layer in the recess. After that, a dielectric cap layer is deposited and etched together with the metal material layer and the etch stop layer to form the metal grid. According to the present invention, the deposited metal material layer has reduced surface roughness, which can result in improved thickness uniformity of the resulting metal grid. Moreover, the problems with the prior art arising from the necessary additional etching of the silicon oxide layer and the silicon nitride layer under the metal material layer (e.g., W layer) to be processed into the metal grid, including pinholes in the surface of the dielectric cap layer residing on the top surface of the metal grid and residuals of the silicon nitride layer under the metal grid, can be avoided. Further, the steps in the prior art for etching the silicon oxide layer and the silicon nitride layer under the metal material layer to be processed into the metal grid and for depositing a hard mask layer on the top surface of the dielectric cap layer can be omitted, allowing for overall easier formation of the metal grid, resulting in savings in cost and increased performance of the device being fabricated, and thus meeting the demand for a high grid and a more powerful image sensors.

Based on the same inventive concept, referring to FIGS. 3 to 4, in an embodiment of the present invention, there is provided a backside illuminated (BSI) image sensor, which can be made using the method of the present invention as defined above. The BSI image sensor includes: a substrate 200 defining a pixel region I and a logic region II; a conductive component 200a; a conductive pillar 204; a bond pad 207; and an etch stop layer 205, a metal material layer 206 and a dielectric cap layer 208, which are sequentially deposited over a backside of the substrate 200 in a geometric conformity manner.

The logic region II is peripheral to the pixel region I, and the conductive component 200a is buried in the substrate 200 in the logic region II so as to be close to a front side thereof. The bonding pad 207 is accommodated in a recess 204a which is formed in the backside of the substrate 200 in the logic region II and in positional correspondence with the conductive component 200a. The bonding pad 207 resides on a bottom surface of the recess 204a. On the front side of the substrate 200 in the logic region II, there may also be formed logic devices and device isolation structures. The conductive component 200a may be a metal interconnect in electrical connection with one of the logic devices on the substrate 200 in the logic region II. For further structural details of the front side of the substrate 200 in the logic region II, reference can be made to the above description in connection with step S1, and any further detailed description thereof is omitted. A buffer dielectric layer 203 may be further formed over the backside of the substrate 200, and may cover the backside of the substrate 200 in the logic region II and may extend from the logic region II over the pixel region I.

The conductive pillar 204 may be received in a through-hole 204c extending from the bottom surface of the recess 204a to a top surface of the conductive component 200a, and a bottom surface of the conductive pillar 204 may be electrically connected to the top surface of the conductive component 200a. For details of the material of the conductive pillar 204, reference can be made to the above description in connection with step S1, and any further detailed description thereof is therefore omitted. The bottom surface of the bonding pad 207 is brought into electrical connection with a top surface of the conductive pillar 204 by the etch stop layer 205 and the metal material layer 206 stacked sequentially over the inter surfaces of the recess 204a.

The etch stop layer 205, the metal material layer 206 and the dielectric cap layer 208 are etched through at multiple locations in the pixel region I, resulting in the formation of a metal grid defining grid cells 209 in which a surface of the buffer dielectric layer 203 is exposed. The dielectric cap layer 208 residing on a top surface of the bonding pad 207 in the logic region II is etched through so that the top surface of the bonding pad 207 is partially exposed.

Optionally, the substrate 200 may include: a device substrate 200b having a front side and a backside; an interlayer dielectric layer 200c, and a carrier substrate 200d. The logic devices may be formed on the front side of the device substrate 200b in the logic region II, and the recess 204a may be formed in the backside of the device substrate 200b in the logic region II. Photodiodes (not shown) may be formed on the front side of the device substrate 200b in the pixel region I. The interlayer dielectric layer 200c may be formed over the front side of the device substrate 200b so as to cover both the logic devices and the photodiodes. Moreover, the metal interconnect serving as the conductive component 200a may be formed in the interlayer dielectric layer 200c so as to be electrically connected to both the conductive pillar 204 and one of the logic devices.

For details of the structural and material of the various components of the BSI image sensor according to this embodiment, reference can be made to the above description in connection with the formation of the metal grid, and any further detailed description thereof is therefore omitted. The BSI image sensor according to this embodiment has improved performance thanks to good thickness uniformity of the metal grid, significantly reduced pinhole defects in the surface of the dielectric cap layer and no residuals at bottoms of the grid cells in the metal grid.

The foregoing description presents merely preferred embodiments of the present invention and is not intended to limit the scope of the present invention in any sense. It is intended that all changes and modifications made by those of ordinary skill in the art in light of the above teachings fall within the scope of the appended claims.

What is claimed is:

1. A method of forming a metal grid, the method comprising:
    providing a substrate in which a conductive component and a conductive pillar are formed, the substrate having a surface in which a recess is formed, the conductive pillar received in a through-hole extending from a bottom surface of the recess to a top surface of the conductive component so as to come into electrical connection with the conductive component;
    successively depositing an etch stop layer and a metal material layer in geometric conformity over surfaces of the substrate, the conductive pillar and the recess;
    forming a bonding pad on the metal material layer in the recess and depositing a dielectric cap layer over the bonding pad and the metal material layer; and
    etching the dielectric cap layer, the metal material layer and the etch stop layer that are peripheral to the recess, to form the metal grid.

2. The method of claim 1, wherein the conductive component comprises a metal interconnect, and/or wherein the etch stop layer is made of a material that is neither silicon oxide nor silicon nitride and is able to prevent a metal from diffusing into the substrate from the metal material layer.

3. The method of claim 1, wherein the step of forming the recess and the conductive pillar in the substrate comprises:
    etching through a partial thickness of the substrate above the conductive component to form the recess;
    depositing a buffer dielectric layer in geometric conformity over the surfaces of the substrate and the recess so that the buffer dielectric layer does not fill up the recess;
    etching the buffer dielectric layer and the substrate that are in positional correspondence with the recess until the top surface of the conductive component is exposed to form the through-hole; and
    filling the through-hole with a conductive material to form the conductive pillar.

4. The method of claim 3, wherein the buffer dielectric layer comprises, sequentially stacked together, a first oxide layer, a nitride layer and a second oxide layer, and wherein the step of filling the through-hole with the conductive material to form the conductive pillar comprises: depositing a conductive material over the second oxide layer and in the through-hole so that the conductive material at least fills up the through-hole; and performing an etch-back process and/or a chemical mechanical planarization to remove the second oxide layer, the nitride layer and the conductive material above top edges of the through-hole, so that the conductive pillar is formed.

5. The method of claim 1, wherein the step of providing the substrate in which the conductive component is formed comprises:
    providing a device substrate having a front side and a backside and forming a logic device and a photodiode on the front side of the device substrate;
    performing a metal interconnect process to form an interlayer dielectric layer covering the logic device and the photodiode on the front side of the device substrate and forming the metal interconnect in electrical connection with the logic device as the conductive component in the interlayer dielectric layer;
    providing a carrier substrate and forming a bonding dielectric layer on the carrier substrate; and
    bonding the interlayer dielectric layer to the bonding dielectric layer to form the substrate in which the conductive component is formed.

6. The method of claim 5, wherein after the interlayer dielectric layer is bonded to the bonding dielectric layer, the device substrate is thinned from the backside thereof, and the recess is formed in the backside of the device substrate through etching a partial thickness thereof.

7. The method of claim 1, wherein when the dielectric cap layer, the metal material layer and the etch stop layer that are peripheral to the recess are etched to form the metal grid, the etch stop layer and a partial thickness of a layer under the etch stop layer are also etched through;
    and/or
    before or after the metal grid is formed, the dielectric cap layer on the top surface of the bonding pad is etched through so that the top surface of the bonding pad is partially exposed.

8. A method of forming a backside illuminated image sensor, the method comprising: providing a substrate defining a pixel region and a logic region; and forming a recess accommodating a bonding pad in a backside of the substrate in the logic region and a metal grid on the backside of the substrate in the pixel region, using the method of claim 1.

9. The method of claim 8, wherein the conductive component comprises a metal interconnect, and/or wherein the etch stop layer is made of a material that is neither silicon oxide nor silicon nitride and is able to prevent a metal from diffusing into the substrate from the metal material layer.

10. The method of claim 8, wherein the step of forming the recess and the conductive pillar in the substrate comprises:
    etching through a partial thickness of the substrate above the conductive component to form the recess;
    depositing a buffer dielectric layer in geometric conformity over the surfaces of the substrate and the recess so that the buffer dielectric layer does not fill up the recess;

etching the buffer dielectric layer and the substrate that are in positional correspondence with the recess until the top surface of the conductive component is exposed to form the through-hole; and filling the through-hole with a conductive material to form the conductive pillar.

11. The method of claim 10, wherein the buffer dielectric layer comprises, sequentially stacked together, a first oxide layer, a nitride layer and a second oxide layer, and wherein the step of filling the through-hole with the conductive material to form the conductive pillar comprises: depositing a conductive material over the second oxide layer and in the through-hole so that the conductive material at least fills up the through-hole; and performing an etch-back process and/or a chemical mechanical planarization to remove the second oxide layer, the nitride layer and the conductive material above top edges of the through-hole, so that the conductive pillar is formed.

12. The method of claim 8, wherein the step of providing the substrate in which the conductive component is formed comprises:

providing a device substrate having a front side and a backside and forming a logic device and a photodiode on the front side of the device substrate;

performing a metal interconnect process to form an interlayer dielectric layer covering the logic device and the photodiode on the front side of the device substrate and forming the metal interconnect in electrical connection with the logic device as the conductive component in the interlayer dielectric layer;

providing a carrier substrate and forming a bonding dielectric layer on the carrier substrate; and bonding the interlayer dielectric layer to the bonding dielectric layer to form the substrate in which the conductive component is formed.

13. The method of claim 12, wherein after the interlayer dielectric layer is bonded to the bonding dielectric layer, the device substrate is thinned from the backside thereof, and the recess is formed in the backside of the device substrate through etching a partial thickness thereof.

14. The method of claim 8, wherein when the dielectric cap layer, the metal material layer and the etch stop layer that are peripheral to the recess are etched to form the metal grid, the etch stop layer and a partial thickness of a layer under the etch stop layer are also etched through;

and/or before or after the metal grid is formed, the dielectric cap layer on the top surface of the bonding pad is etched through so that the top surface of the bonding pad is partially exposed.

* * * * *